US008384388B2

(12) United States Patent
Biber (10) Patent No.: US 8,384,388 B2
(45) Date of Patent: Feb. 26, 2013

(54) MAGNETIC RESONANCE ACQUISITION SYSTEM, RECEIVER ANTENNA MODULE, TRANSMISSION SIGNAL RECEPTION MODULE, MAGNETIC RESONANCE SYSTEM AND METHOD TO TRANSFER MR RESPONSE SIGNALS

(75) Inventor: Stephan Biber, Erlangen/Frauenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 704 days.

(21) Appl. No.: 12/633,859

(22) Filed: Dec. 9, 2009

(65) Prior Publication Data
US 2010/0148778 A1 Jun. 17, 2010

(30) Foreign Application Priority Data

Dec. 17, 2008 (DE) .................. 10 2008 063 460

(51) Int. Cl.
*G01V 3/00* (2006.01)
(52) U.S. Cl. ........................ 324/322; 324/318
(58) Field of Classification Search .................. 324/322, 324/318, 306, 307, 309, 300
See application file for complete search history.

(56) References Cited

U.S. PATENT DOCUMENTS

| 5,572,130 | A | * | 11/1996 | Ratzel | 324/318 |
| 7,098,659 | B2 | | 8/2006 | Reykowski et al. | |
| 7,834,628 | B2 | * | 11/2010 | Biber et al. | 324/318 |
| 8,055,196 | B2 | * | 11/2011 | Biber et al. | 455/41.2 |
| 2006/0103386 | A1 | | 5/2006 | Buchwald | |
| 2011/0123192 | A1 | * | 5/2011 | Rosenthal et al. | 398/43 |

* cited by examiner

*Primary Examiner* — Louis Arana
(74) *Attorney, Agent, or Firm* — Schiff Hardin LLP (57) ABSTRACT

A magnetic resonance receiver system has an antenna arrangement with a number of receiver antenna elements to receive MR response signals. The magnetic resonance system has a combination network arrangement with a number of combination networks in order to combine the MR response signals received by various receiver antenna elements, to form modes, a frequency multiplexer arrangement downstream of the combination network that superimposes at least some of the modes in a common transmission signal, and a transmission line arrangement with a number of transmission lines in order to respectively transfer the transmission signals to an input channel of a first channel switching matrix. This input channel is associated with the transmission line. Downstream of the first channel switching matrix is a frequency demultiplexer arrangement that filters the modes superimposed in a transmission signal out of the transmission signal. Downstream of the frequency demultiplexer arrangement is a second channel switching matrix that connects the modes at specific inputs of an MR signal processing device.

14 Claims, 4 Drawing Sheets

MAGNETIC RESONANCE ACQUISITION SYSTEM, RECEIVER ANTENNA MODULE, TRANSMISSION SIGNAL RECEPTION MODULE, MAGNETIC RESONANCE SYSTEM AND METHOD TO TRANSFER MR RESPONSE SIGNALS

BACKGROUND OF THE INVENTION

1. Field of the Invention

The present invention concerns a magnetic resonance acquisition system of the type having an antenna arrangement with a number of receiver antennas to receive MR response signals. The invention also concerns a receiver antenna module of the type having at least one group of receiver antenna elements to receive the MR response signals, and at least one combination network associated with the group of receiver antenna elements in order to combine the MR response signals received by the receiver antenna elements to form modes. Furthermore, the invention concerns a transmission signal receiver module of the type having a channel switching matrix; with a number of input channels for connection with transmission lines of a transmission line arrangement; a number of output channels; and a control input to activate the channel switching matrix in order to connect a transmission signal received at one input channel to an output channel to relay the transmission signal to an input of an MR signal processing device. The invention also concerns a magnetic resonance system with such a magnetic resonance acquisition system as well as a method to transfer MR response signals from an antenna arrangement with a number of receiver antenna elements to an MR signal processing device, of the type wherein initially MR response signals received by different receiver antenna elements are combined into modes and these modes are then transferred to the MR signal processing device.

2. Description of the Prior Art

In a magnetic resonance examination, local coils are predominantly used to receive the magnetic resonance (MR) response signals. These local coils are receiver antenna modules that contain at least one, but often multiple, receiver antenna elements, generally in the form of conductor loops. The received MR response signals are normally pre-amplified while still in the local coil and are conducted out of the central region of the magnetic resonance system via cables and supplied to a shielded receiver of an MR signal processing device. In the processing device, the acquired data are then digitized and processed further. In many examinations, a number of such local coils are arranged on the patient in order to cover entire regions of the body of the patient. It therefore often occurs that the number of the antenna elements to be used during an examination exceeds the number of input channels that are present at the MR signal processing device, or the number of receiver modules of such an MR signal processing device. It is normally the case, however, that all antenna elements are not simultaneously used during such a measurement, since often only those antenna elements located in a specific region in which a magnetic resonance excitation is presently occurring actually receive MR response signals. Receiver elements whose field of view would not encompass the body region from which MR signals originate during a specific measurement sequence are normally deactivated. In order to thus connect multiple receiver antenna elements to an MR signal processing device that has only a lower number of input channels, a channel switching matrix (also more often called an RCCS: Receive Coil Channel Selector) is therefore used at the MR signal processing device. This switching matrix can be activated so that the currently active receiver antenna elements, or the outputs of the local coils that belong to these antenna elements, are connected to the available input channels of the MR signal processing device. The typical active elements are predominantly those elements that are situated in the homogeneity volume of the magnet.

In order to be able to use the same receiver system with different MR signal processing devices that respectively have different numbers of input channels, or to more easily, retroactively expand the number of receiver channels in a magnetic resonance system, a method to transfer MR response signals of the aforementioned type is described in DE 103 13 004 A1, in which, initially, the MR response signals received by different receiver antenna elements are combined into combinations are known as modes, that are then transferred to the MR signal processing device. A "mode" in this context means a distribution of the sensitivity in the antenna field as a function of space (spatial coordinates). A mode is thus an analog output signal that is formed as a linear combination of the MR response signals of the different receiver antenna elements that are used. This linear combination can be formed in a combination network arrangement composed of a number of combination networks (known as mode matrices). A mode matrix is, for example, a circuit formed of phase shifters and hybrids that combine the signals according to magnitude and phase so that n linear, independent modes can be generated from n input signals. Such a linear combination can be, for example, the sum of multiple MR response signals, wherein each MR response signal, phase-shifted and weighted, can be entered into the sum. A sum of, for example, two signals with a phase difference of 180° corresponds to a difference signal of the two signals. In an extreme case of a linear combination, all signals except for one, with a weight of 0, can enter into the linear combination, such that the resulting mode corresponds to the one MR response signal that was possibly still phase-shifted. In the normal case, however, at least two MR response signals are linearly combined with one another. The modes are preferably formed so that at least one primary mode is formed that already offers the most important image information and the maximum signal-to-noise ratio in the center of the current measurement field of view (FOV). The use of the higher modes then increasingly offers an improvement of the signal-to-noise ratio in the peripheral regions of the FoV and in particular enables the application of parallel imaging techniques. The mode matrices or the combination network arrangement are/is located in the individual local coils, such that instead of the MR response signals, the modes formed thereby can be transferred via cables to the input channels of the MR signal processing device. By the interconnection of the typical channel switching matrix (RCCS), the possibility then exists to decide whether all signal information is read out by a lower number of local coils in order to use these for a parallel imaging technique, or whether instead at least the primary mode is read out by a larger number of receiver antenna elements in order to thus graphically acquire an optimally large spatial region and nevertheless to obtain a relatively good signal-to-noise ratio in the most important regions.

The number of transmission channels from the local coils to the MR signal processing device is not reduced by this method. As cited above, these transmission lines normally run in shielded cables, and the number of such cables that occur with increasing number of receiver antenna elements or local coils is an ever-increasing problem, since the cable bundles that are thereby formed are very unwieldy and are additionally exposed to increased mechanical stresses due to the movement of the patient bed.

SUMMARY OF THE INVENTION

An object of the present invention is to provide an improved magnetic resonance acquisition system, a receiver antenna module that can be used therein, a transmission signal receiver module that can be used therein, and a corresponding method to transmit MR response signals, that reduce the aforementioned problem and additionally allow a particularly flexible use and an easy scalability of the acquisition system or of the magnetic resonance signal processing device thereof.

In addition to the antenna arrangement with a number of receiver antenna elements to receive the MR response signals, a magnetic resonance acquisition system according to the invention (called an MR acquisition system in the following) requires a combination network arrangement of the aforementioned type that is fashioned to combine the MR response signals received by various receiver antenna elements to form modes. This combination network arrangement has one or more combination networks (i.e. the aforementioned mode matrices), that each combine the MR response signals that are present at the inputs of the respective mode matrix into the desired linear combination and outputs the combination as (advantageously linear) an independent mode at the output of the mode matrix.

According to the invention, the MR receiver system has a frequency multiplexer arrangement downstream of the combination network, the frequency multiplexer arrangement being designed to superimpose at least some of the modes to form a common transmission signal for that group of modes by means of frequency multiplexing. This frequency multiplexer arrangement thus forms a signal merging device in which multiple modes are merged into one signal. The frequency multiplexer arrangement can be composed of a frequency multiplexer element that merges two or more modes into one transmission signal, or of a number of frequency multiplexer elements that each merge at least two modes.

The receiver system furthermore has a transmission line arrangement with a number of transmission lines in order to respectively transfer the transmission signals to respective input channels of a first channel switching matrix, with one input channel being associated with each transmission line. The transmission lines can be wireless (for example as radio links, infrared transmission links or the like). They can also be transmission cables; both conventional typical transmission cables and other cables (for example optical wave guides etc) being suitable.

The first channel switching matrix of the receiver system has a number of input channels that connect with the transmission lines of the transmission line arrangement and a number of output channels as well as a control input to activate the first channel switching matrix in order to connect a transmission signal received at one input channel through to a specific output channel. This first channel switching matrix can be a typical RCCS, for example.

According to the invention, downstream of the first channel switching matrix is a frequency demultiplexer arrangement which is fashioned to filter the modes superimposed in a transmission signal out of that transmission signal. This is a signal separation device that, for example, can have a number of individual frequency demultiplexer elements. The number of frequency demultiplexer elements normally corresponds to the number of frequency multiplexer elements of the combination network arrangement that combined the modes into the common transmission signals.

According to the invention, downstream of the frequency demultiplexer arrangement is a second channel switching matrix that connects the modes at specific inputs of the MR signal processing device. This MR signal processing device can be a typical MR signal processing device that contains typical magnetic resonance RX transmit modules that respectively form an input channel. An analog-digital converter is normally located at the input of such an MR signal processing device in order to digitize the analog signal.

In the method according to the invention to transfer the MR response signals from the antenna arrangement to the MR signal processing device, MR response signals received by different receiver antenna elements are thus initially combined into modes, then at least some of the modes are overlaid in groups to form a common transmission signal by means of a frequency multiplexing method. The common transmission signal is transmitted via the transmission line arrangement to an input channel of the first channel switching matrix that is associated with the appertaining transmission line. The first channel switching matrix is controlled so that the transmission signal received on a specific input channel is connected through to a specific output channel, from which it is then passed to a frequency demultiplexer arrangement. In the frequency demultiplexer arrangement, the superimposed modes are then filtered out of the transmission signal and the modes are supplied to a second channel switching matrix. This is fashioned or controlled so that at least some of the modes are connected through to specific inputs of an MR signal processing device.

The MR receiver system and method according to the invention offer the possibility to very flexibly select which MR response signals are respectively evaluated in the current measurement sequence given a number of receiver antenna elements or local coils, whose number significantly exceeds that of the input channels of the MR signal processing device. By the superimposition of multiple modes, the number of transmission lines (in particular the number of cables required in a conventional magnetic resonance system) can be significantly reduced. In particular, by the use not only of a first channel switching matrix before the frequency demultiplexer arrangement but also a second channel switching matrix after the frequency demultiplexer arrangement it is possible to select the correct modes in spite of the superimposition of the modes in the frequency multiplexing method, independent of the position of the local coils within the measurement space of the magnetic resonance system, for example to select from among a number of local coils the respective primary mode that delivers the significant signal portions from the central region of the field of view. Since the modes are obtained from an amplitude and phase weighting of the received individual signals, the formation of the modes also depends on the position of the local coil relative to the B0 field. In particular, given non-stationary local coils (as are used for anterior abdominal imaging, for example) the local coil can be applied on the patient rotated by 180°. The correct mode can thus be selected by the second channel switching matrix even given the combination described above of frequency multiplexing and mode formation depending on the rotation position of the coil.

A receiver antenna module according to the invention for such an MR receiver system has at least one group of receiver antenna elements to receive the MR response signals and at least one combination network associated with the group of receiver antenna elements in order to combine the MR response signals received by the receiver antenna elements to form modes. According to the invention, the receiver antenna module also has at least one frequency demultiplexer associated with the combination network in order to superimpose the modes in a common transmission signal. This receiver antenna module can be integrated as a complete local coil into a housing which is positioned in the measurement space of the magnetic resonance system like a conventional local coil in a measurement.

For an MR receiver system according to the invention, a transmission signal receiver module outside of the measurement space (i.e. after the transmission lines, generally in proximity to the MR signal processing device) is required that has a first channel switching matrix, a frequency demultiplexer arrangement downstream of the first channel switching matrix and a second channel switching matrix downstream of the frequency demultiplexer arrangement as described above.

In addition to the typical components of a conventional magnetic resonance system, a magnetic resonance system according to the invention requires an MR receiver system designed according to the invention so, without additional measures, it is possible to retrofit conventional magnetic resonance systems by the use of the receiver antenna modules according to the invention and by the use of a transmission signal receiver module according to the invention.

In a preferred variant, downstream of the second channel switching matrix is a time period multiplexer arrangement in order to switch multiple modes at a common physical input of the MR signal processing device. The number of the inputs of the MR signal processing device can therefore be increased insofar as that multiple logical inputs which are formed by specific time windows are placed at one physical input. Moreover, it should be noted that the input channels of the MR signal processing device need not necessarily be physical inputs, but can be input channels in which the incoming signals can ultimately be separately used further in the MR signal processing device. Thus the inputs may be logic inputs as can be realized at a physical input with, for example, such a time period multiplexer method.

An analog/digital converter is normally located at the physical input of an MR signal processing device anyway, which means that the analog signal is sampled with a specific sampling rate. In this case a design of the time period multiplexer arrangement is particularly designed so that it operates with n-times the clock frequency of the sampling frequency in order to merge n input signals at a common input.

To superimpose the modes in the frequency multiplexing method, the modes are advantageously reduced to intermediate frequencies. For this purpose, the frequency multiplexer arrangement can have a number of suitable mixers or the like in order to downmix the modes. A transmission of the MR response signals normally ensues with the received MR frequency. This leads to the signal that the cables used must be adapted to the radio frequency in order to ensure an optimally low-attenuation transmission. The preamplifiers previously used in the local coils must additionally have a particularly good linearity of the characteristic amplifier line across a large range in order to form low-distortion output signals, which is linked with a high power requirement and with significant warming near the patient. If the local coils should be used in magnetic resonance systems that can receive magnetic resonance signals not only of hydrogen but also of other atoms or metabolites, it is necessary to use broadband receivers and to use transmission networks that allow an adaptation to the various magnetic resonance frequencies. The reduction of the modes to intermediate frequencies before transmission has the advantage that the required radio-frequency power for signal transmission can now be generated at a lower frequency, namely the intermediate frequency range. Given the same linear requirement at the amplifiers, less power is required for this purpose. A lower driver power at the amplifiers is also required due to the lower cable attenuation in the intermediate frequency range, so DC power can likewise be saved. The transmission at intermediate frequencies additionally places smaller demands on the transmission lines that are used. For example, within the transmission lines it is possible to use simple plug connectors with single pins instead of expensive coaxial multiple pin connectors. Requirements for a cable and plug shielding and radio-frequency impermeability can additionally be reduced, since a feedback of amplified signals at the receiver antenna elements of the local coils is ineffective because the transmission signals conducted on the connection cable no longer lie in the frequency range in which the receiver antenna elements are sensitive. Even in multiple-nuclei applications, MR response signals of different MR frequencies can be mixed in the same intermediate frequency range by frequency conversion that occurs within the local coil. Only an application of the respective local oscillator frequency that is used is necessary. The receiver (i.e. the MR signal processing device) likewise need only be adapted to the hard-set intermediate frequency bandwidth, and thus can be used for all examined nuclei. Broadband ferrite modules that have previously been required are thus superfluous, which enables the input components of the MR signal processing device to be positioned closer to the magnet of the magnetic resonance system so the cable lengths can be markedly reduced. The frequency demultiplexer arrangement must have only corresponding mixers and sources for the required intermediate frequencies. Possibilities to realize this are explained in detail later.

As mentioned above, the MR signal processing device normally has at its input side, an analog-digital converter for the received modes. In this case, the intermediate frequencies are advantageously set mirror-symmetrical to a sampling frequency or to a multiple of the sampling frequency of the analog-digital converter. This means that resulting intermediate frequencies are generated that lie in different alias bands of the sampling. The Nyquist bandwidth of the analog-digital conversion that must be set for a frequency multiplexer does not need to be chosen greater than that for a system without frequency multiplexing. Sampling at the receiver of the transmitted magnetic resonance signals can advantageously ensue in the same baseband and in the same frequency position, so that an additional processing is significantly simplified.

A rule for preferred selection of the two intermediate frequency ranges of the arrangement according to the invention can be as follows:

$$IF_1 = FS + \Delta F$$

$$IF_2 = FS - \Delta F$$

wherein IF1 is a first intermediate frequency range, IF2 is a second intermediate frequency range, FS is a sampling frequency of an analog-digital converter that is used at the receiver that can be associated with a channel of the local coil, and $\Delta F$ is a frequency interval with a preferred value between 0 and FS/2. Preferred values for $\Delta F$ lie approximately between 1/8·FS and 3/8·FS, due to the simplified dimensioning of the transmission-side filter that is then enabled. In an exemplary embodiment, the arrangement according to the invention uses a first intermediate frequency range from 7.5 MHz to 9 MHz and a second intermediate frequency range from 11 MHz to 12.5 MHz.

For example, the frequency multiplexer arrangement can have a number of diplex filters which are fashioned so that they respectively overlay two modes in a common transmission signal. A mixer that downmixes the respective modes to the desired intermediate frequencies beforehand is then located upstream of the diplex filter at each of the two inputs.

The local oscillator frequencies required for downmixing can be transmitted in the reverse direction—for example on the transmission lines that also serve for the transfer of the transmission signals containing the modes from the local coils to the MR signal processing device—and be filtered out by suitable filters at the local coils and be used for the mixers. However, in principle it is also possible to use separate cables to feed in the local oscillation frequencies.

If the frequency multiplexer arrangement has a number of diplex filters, the frequency demultiplexer arrangement should likewise advantageously have a number of diplex filters that are fashioned in order to respectively filter the two modes out of the common transmission signals.

There are various possibilities to design the second channel switching matrix. This can be designed in the same manner as the first channel switching matrix—for example like a conventional RCCS—in order achieve a nearly arbitrary switching of different defined inputs to defined outputs via a control input. However, a discrete design of the second channel switching matrix is also possible with a number of crossover switches that can be activated individually or jointly. Insofar as the frequency demultiplexer arrangement has a number of frequency demultiplexers (for example the aforementioned diplex filters), the second channel switching matrix preferably has a number of crossover switches that are respectively associated with one of the frequency demultiplexers in order to respectively, selectively connect one of the outputs of the respective associated frequency demultiplexer through to the MR signal processing device.

As explained above, the combination networks or the mode matrices are fashioned so as to generate a specific base mode or primary mode in which all signal information from the central region of the FoV is contained with a sufficient signal-to-noise ratio. This is typically a mode known as the CP mode (circularly polarized mode). Therefore, the second channel switching matrix is preferably fashioned so that it can be switched between a first switching situation in which the CP modes of all receiver antenna modules are switched to inputs of the MR signal processing device and a second switching situation in which all modes of at least one receiver antenna module are switched to inputs of the MR signal processing device. This enables switching between a maximum FoV and the use of individual receiver antenna modules in a parallel imaging method utilizing all receiver antenna elements present in the respective receiver antenna modules that are used.

DESCRIPTION OF THE PREFERRED EMBODIMENTS

Figure 1:
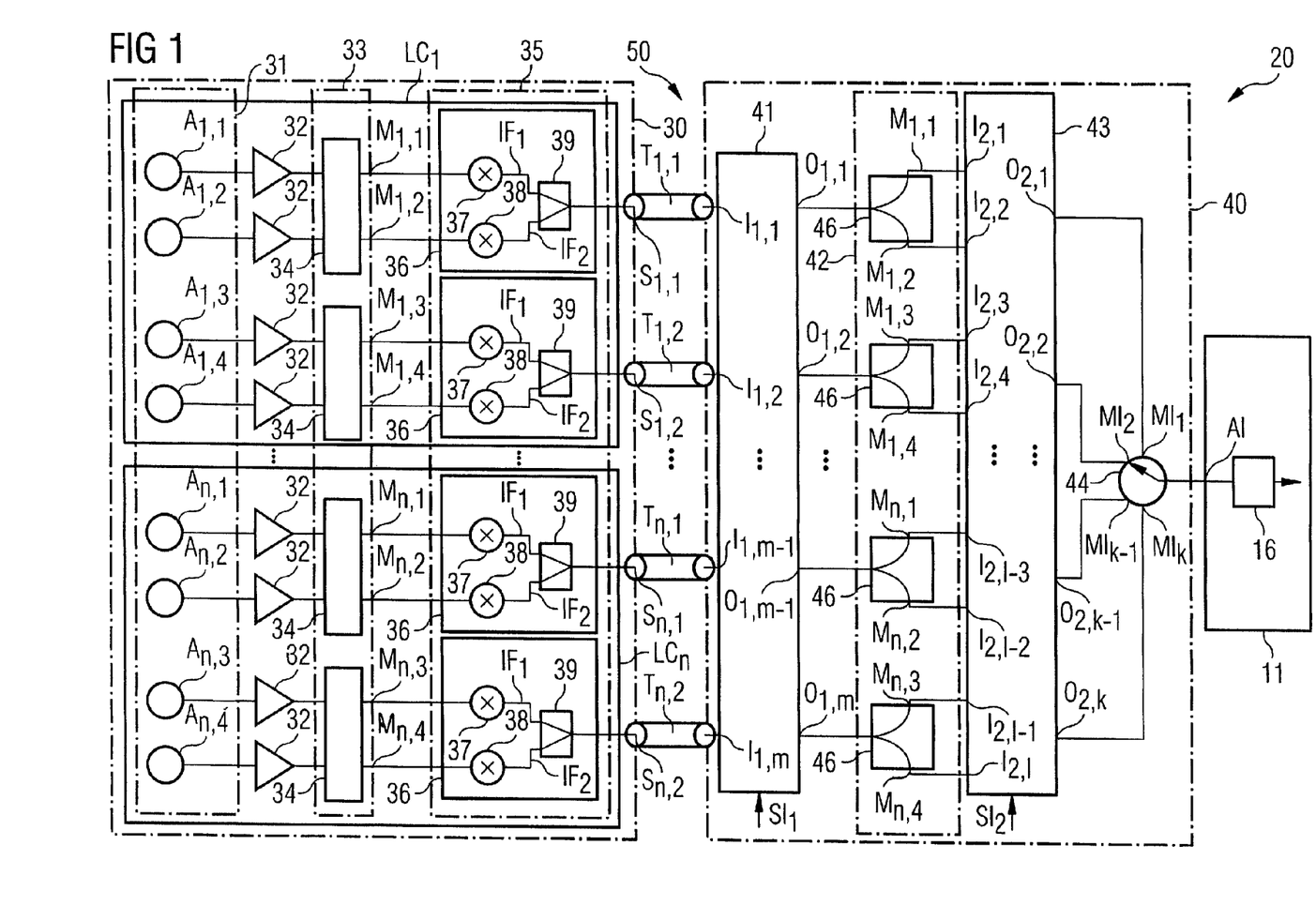
FIG. 1 is a schematic block circuit diagram of a first exemplary embodiment of an MR receiver system according to the invention.
Figure 2:
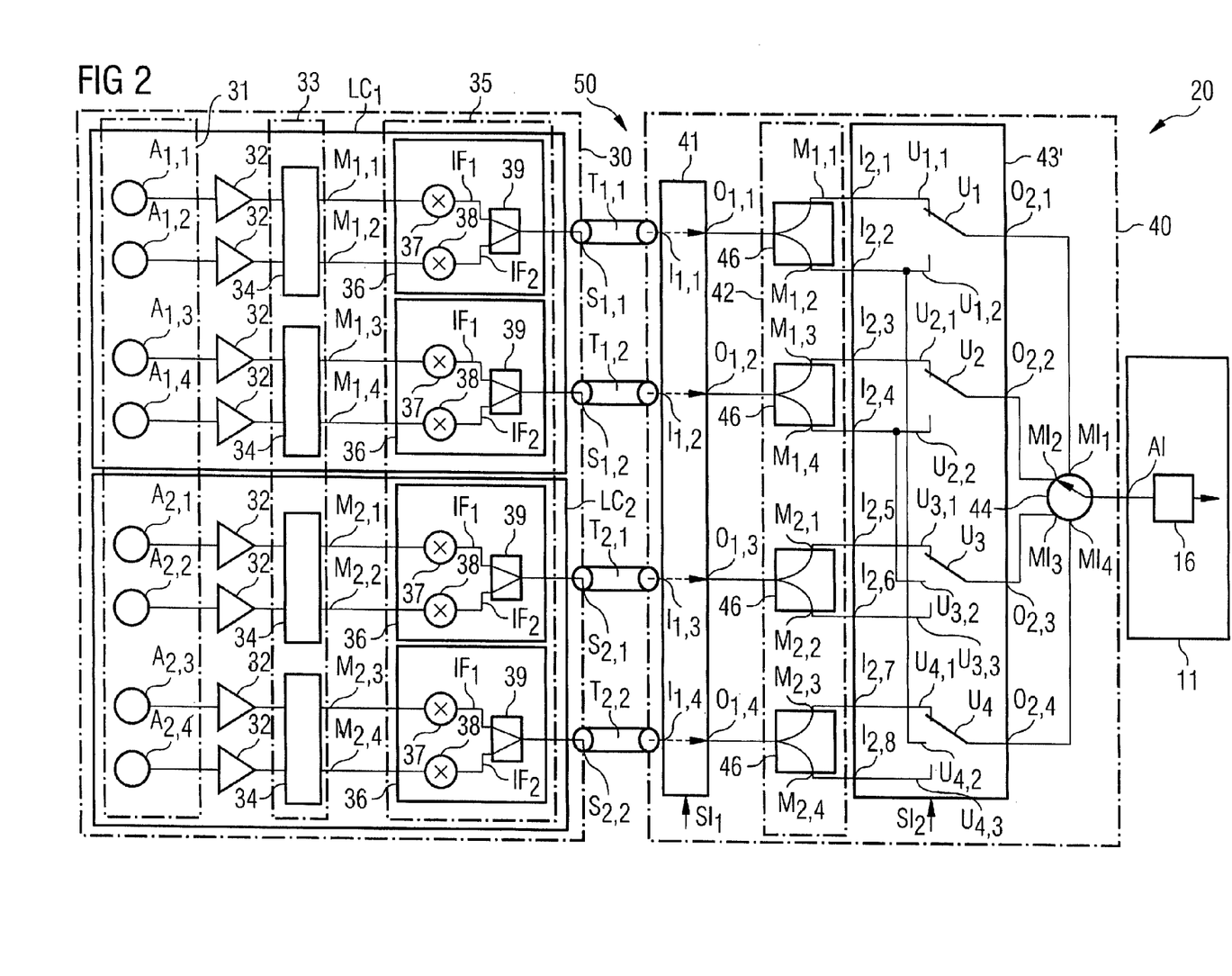
FIG. 2 is a schematic block circuit diagram of a second exemplary embodiment of a receiver system according to the invention in a first switching situation of the RCCS.
Figure 3:
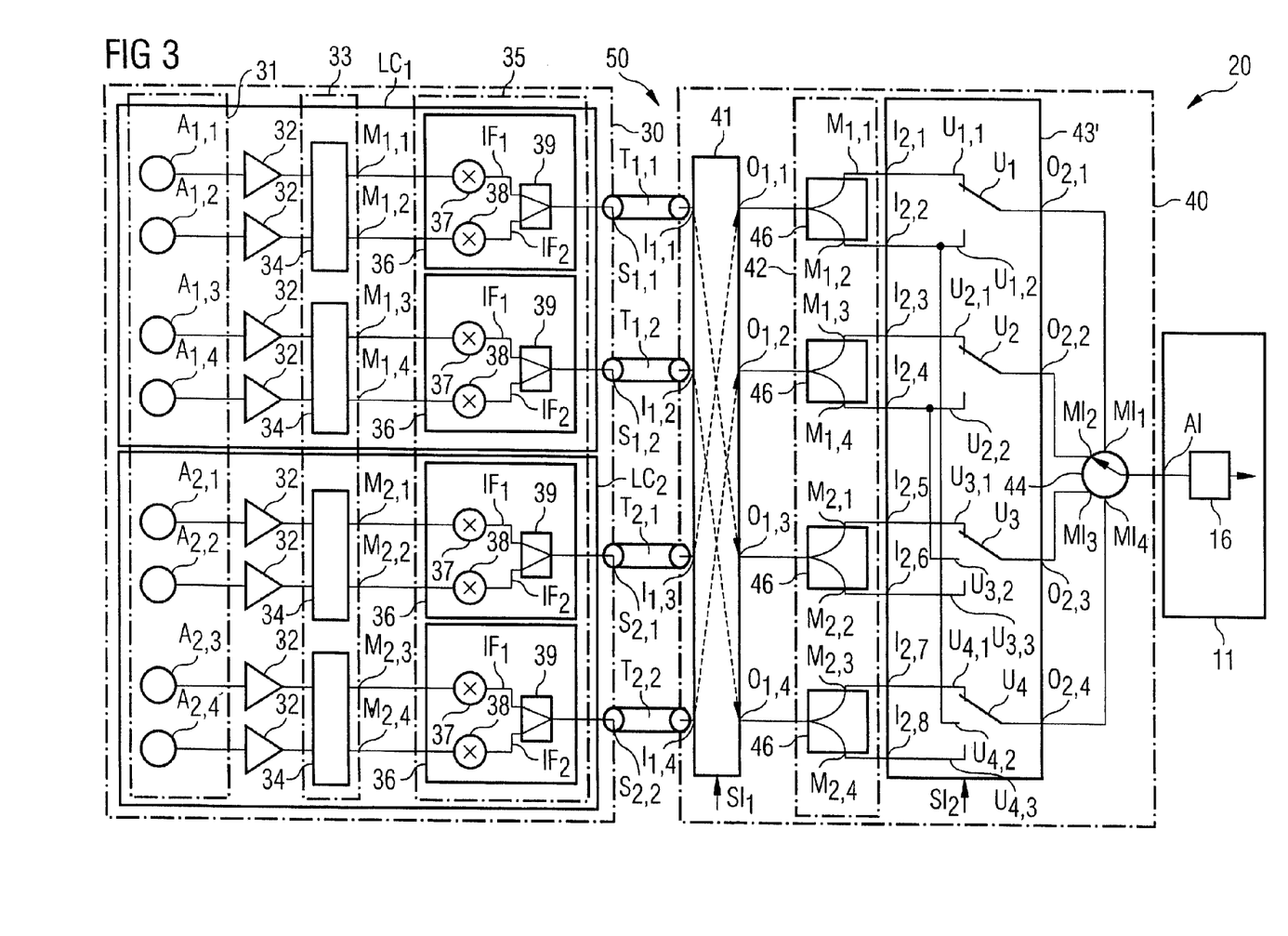
FIG. 3 is a schematic block circuit diagram of a second exemplary embodiment of an MR receiver system according to the invention in a second switching situation of the RCCS.
Figure 4:
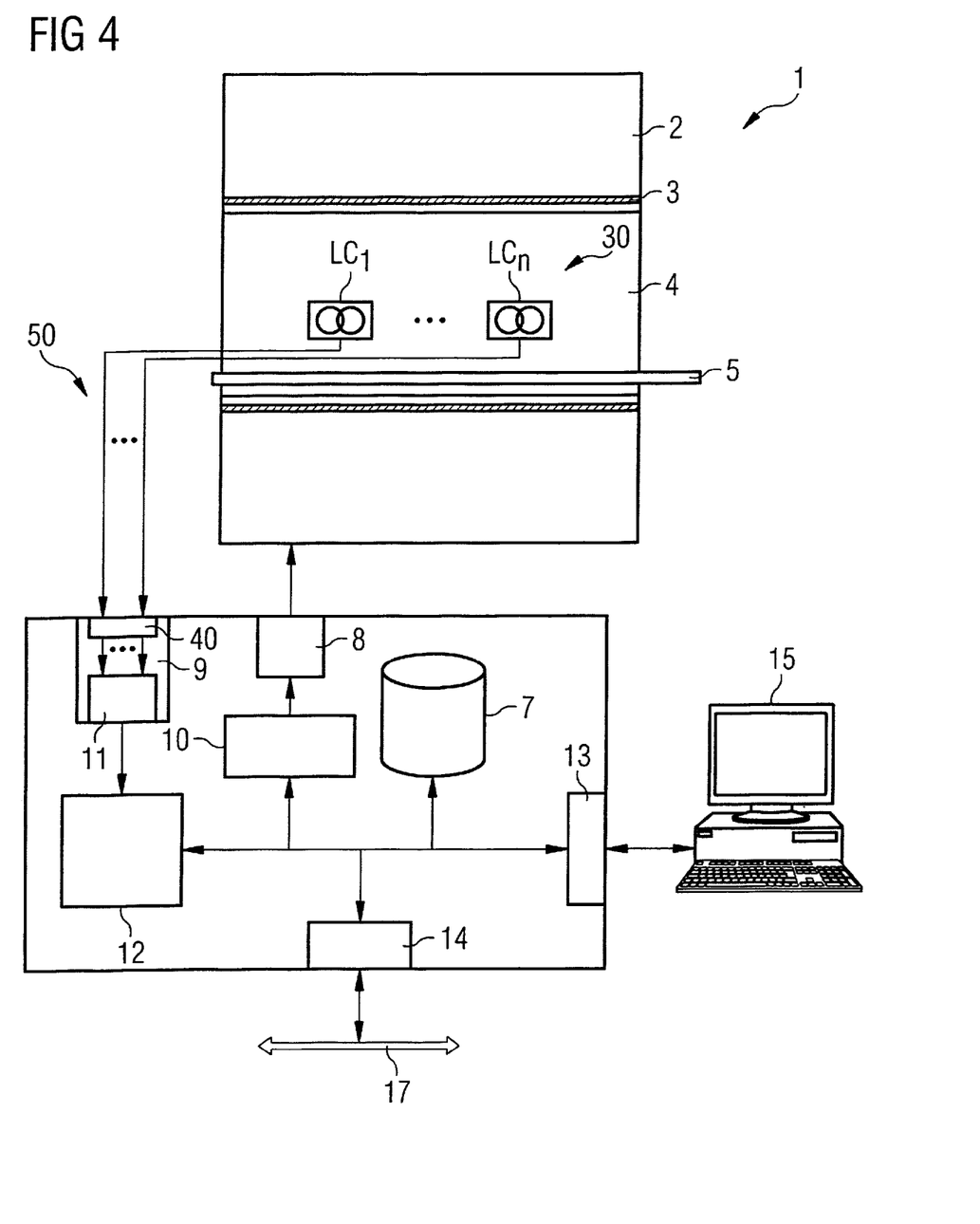
FIG. 4 is a schematic representation of an exemplary embodiment of an MR tomography system with an exemplary embodiment of an MR receiver system according to the invention.

In the exemplary embodiments according to FIG. 1 through FIG. 3, the MR receiver system 20 respectively consists of a local coil arrangement 30 with a number of local coils $LC_1, LC_2, \ldots, LC_n$ and a transmission signal receiver module 40 connected with the local coil arrangement 30 via a transmission line arrangement 50. As is shown in FIG. 4, the local coil arrangement 30 is respectively arranged in a measurement space 4 of a tomograph 2 or, respectively, scanner of the magnetic resonance system 1, in contrast to which the transmission signal receiver module 40 is localized in an associated control device 6 of the magnetic resonance system 1.

Part of this control device 6 is also the MR signal processing device. Only one MR signal processing device 11 with a physical input AI, at which one analog-digital converter 16 is located, is shown in FIGS. 1 through 3. The system can be scaled arbitrarily, however, meaning that an arbitrary number of physical inputs AI of the MR signal processing device 11 can be operated given a corresponding embodiment of the MR receiver system 20. Only one physical input AI is shown in Figures ml through 3 for better clarity.

In the receiver system 20 according to FIG. 1, the local coil arrangement 30 comprises in total n local coils $LC_1, \ldots, LC_n$ which here are all of similar design. Each of these local coils $LC_1, \ldots, LC_n$ has a number of receiver antenna elements $A_{1,1}, A_{1,2}, A_{1,3}, A_{1,4}, \ldots, A_{n,1}, A_{n,2}, A_{n,3}, A_{n,4}$. These receiver antenna elements $A_{1,1}, A_{1,2}, A_{1,3}, A_{1,4}, \ldots, A_{n,1}, A_{n,2}, A_{n,3}, A_{n,4}$ together form the antenna arrangement 31. A low-noise preamplifier 32 (here what is known as an LNA (Line Amplifier)) as is also used in conventional local coils is associated with each of these receiver antenna elements $A_{1,1}, A_{1,2}, A_{1,3}, A_{1,4}, \ldots, A_{n,1}, A_{n,2}, A_{n,3}, A_{n,4}$.

In the shown exemplary embodiment, two adjacent receiver antenna elements $A_{1,1}, A_{1,2}$ form a first receiver antenna element group $G_{1,1}$ and two additional adjacent receiver antenna elements $A_{1,3}, A_{1,4}$ form a second group $G_{1,2}$ in the first local coil $LC_1$. The receiver antenna elements $A_{n,1}, A_{n,2}$ likewise form a first group $G_{n,1}$ and the receiver antenna elements $A_{n,3}, A_{n,4}$ form a second group $G_{n,2}$ in the local coil $LC_n$. The signals of two respective receiver antenna elements grouped in such a manner are processed together in a mode matrix 34 in order to form from these modes $M_{1,1}, M_{1,2}, M_{1,3}, M_{1,4}$ and $M_{n,1}, M_{n,2}, M_{n,3}, M_{n,4}$.

The mode matrices 34 are each designed so that one of the two modes $M_{1,1}, M_{1,2}, M_{1,3}, M_{1,4}$ and $M_{n,1}, M_{n,2}, M_{n,3}, M_{n,4}$ forms a CP mode $M_{1,1}, Mn_{1,3}, Mn_{,3}$ and the other mode forms an ACP mode (anti-circularly polarized mode) $M_{1,2}, M_{1,4}, M_{n,2}, M_{n,4}$. The CP mode $M_{1,1}, M_{1,3}, M n_{,1}, Mn_{,3}$ thereby forms a primary mode which alone suffices to reconstruct an MR exposure since it already supplies all necessary information about the central region exposed in both receiver antenna elements with good signal-to-noise ratio. The ACP mode $M_{1,2}, M_{1,4}, M_{n,2}, M_{n,4}$ supplies additional signal portions in order to improve the signal-to-noise ratio in the peripheral regions. The use of both modes $M_{1,1}, M_{1,2}, M_{1,3}, M_{1,4}$ and $M_{n,1}, M_{n,2}, M_{n,3}, M_{n,4}$ is useful when the receiver antenna elements should be used for a parallel imaging.

A detailed explanation of how such mode matrices 34 can be designed is found in the aforementioned DE 103 13 004 B1, for example. The mode matrices $LC_1, \ldots, LC_n$ respectively form a combination network arrangement 33. The mode matrices do not necessarily need to be designed as 4-gate matrices, but can also be designed such that an arbitrary number (for example n) of MR response signals from n receiver antenna elements can be processed into n linear, independent modes that can be output at n inputs of a mode matrix. Inasmuch it would be sufficient if each local coil $LC_1, \ldots, LC_n$ possesses a single mode matrix that combines all signals of the receiver antenna elements that are presented in the appertaining local coil $LC_1, \ldots, LCn$.

In the exemplary embodiment shown in FIGS. 1 through 3, a frequency multiplexer 36 with two inputs and one output is downstream of each mode matrix 34. In this frequency multiplexer 36 the two modes of a mode matrix 34 are merged into a transmission signal $S_{1,1}, S_{1,2}, S_{1,3}, S_{1,4}$. The frequency multiplexers 36 of all local coils $LC_1, \ldots, LC_n$ again jointly form a frequency multiplexer arrangement 35. Here it is also the case that, instead of the individual frequency multiplexers 36 which respectively superimpose only two modes into a signal, other frequency multiplexers can also be used that are in the position to superimpose more than two input signals.

Each frequency multiplexer 36 has mixers 37, 38 at its inputs. The outputs of the mixers 37, 38 are connected with the inputs of a diplex filter 39. In these mixers 37, 38 the modes are respectively downmixed from the MR frequency to an intermediate frequency $IF_1$, $IF_2$. The intermediate frequencies $IF_1$, $IF_2$ are selected so as to be symmetrical to a sampling frequency of the analog-digital converter 16 of the MR signal processing device 11. For this purpose, suitable local oscillator frequencies are supplied to the mixers 37, 38. For example, this can ensue in the reverse direction via the transmission lines $T_{1,1}, T_{1,2}, T_{n,1}, T_{n,2}$ of the transmission line arrangement 50. In this case corresponding local oscillators as well as means in order to feed the local oscillation frequencies into the transmission lines $T_{1,1}, T_{1,2}, T_{n,1}, T_{n,2}$ must be present at the transmission receiver module 40.

Suitable devices in order to filter these local oscillation frequencies out again and supply them to the mixers 37, 38 must be preset at the local coils $LC_1$, $LC_n$. Suitable components for this are known in principle to the man skilled in the art and therefore are not shown in FIG. 1 for clarity. Different ways to realize such frequency multiplexers in magnetic resonance local coils are explained in DE 10 2008 023 467.

The transmission signals $S_{1,1}, S_{1,2}, S_{n,1}, S_{n,2}$ are transferred to inputs $I_{1,1}, I_{1,2}, \ldots, I_{1,m-1}, I_{1,m}$ of a first channel switching matrix 41 (called RCCS 41 in the following) via the transmission lines $T_{1,1}, T_{1,2}, T_{n,1}, T_{n,2}$ of the transmission line arrangement 50, which here can be formed by simple coaxial cables, for example. This RCCS 41 possesses in total m inputs and likewise m outputs $O_{1,1}, O_{1,2}, \ldots, O_{1,m-1}, O_{1,m}$. Via a control input $SI_1$, the RCCS 41 can be controlled so that an arbitrary input $I_{1,1}, I_{1,2}, \ldots, I_{1,m-1}, I_{1,m}$ can be connected through to an arbitrary defined output $O_{1,1}, O_{1,2}, \ldots, O_{1,m-1}, O_{1,m}$. It is not absolutely necessary that an RCCS 41 is used that has the same number of inputs and outputs. In principle, an RCCS 41 can also be used that, for example, has a significantly higher number of inputs than outputs are present [sic], at least when only a portion of the signals received at the inputs can be additionally processed anyway.

As is apparent in FIG. 1, a frequency multiplexer arrangement 42 is downstream of the RCCS 41. Here this consists of a number of individual diplex filters 46 which are fashioned such that they filter out again the modes $M_{1,1}, M_{1,2}, M_{1,3}, M_{1,4}, \ldots, M_{n,1}, M_{n,2}, M_{n,3}, M_{n,4}$ contained in the respective transmission signals $S_{1,1}, S_{1,2}, \ldots, S_{n,1}, S_{n,2}$ switched to outputs $O_{1,1}, O_{1,2}, \ldots, O_{1,m-1}, O_{1,m}$ associated with the degrees of freedom 46. Each diplex filter 46 thus has two outputs that are connected to two separate inputs $I_{2,1}, I_{2,2}, I_{2,2}, I_{2,4}, \ldots, I_{2,1-3}, I_{2,1-2}, I_{2,1-1}, I_{2,1}$ of a second channel switching matrix. This second channel switching matrix 43 is also designated in the following as an IF selector 43 in order to differentiate it from the RCCS 41. This IF selector 43 in turn has a number of outputs $O_{2,1}, O_{2,2}, \ldots, O_{2,k-1}, O_{2,k}$ as well as a control signal input $SI_2$. Via the control signal input $SI_2$, the IF selector 43 can be controlled so that a connection of very specific inputs $I_{2,1}, I_{2,2}, I_{2,2}, I_{2,4}, \ldots, I_{2,1-3}, I_{2,1-2}, I_{2,1-1}, I_{2,1}$ to very specific individual outputs $O_{2,1}, O_{2,2}, \ldots, O_{2,k-1}, O_{2,k}$ are connected.

The outputs $O_{2,1}, O_{2,2}, \ldots, O_{2,k-1}, O_{2,k}$ of the IF selector 43 are in turn connected with inputs $MI_1, MI_2, MI_k$ of a time period multiplexer 44 whose output is ultimately connected with the physical input AI of the analog-digital converter 16 of the MR signal processing device 11. Here function blocks 45 are drawn between the outputs $O_{2,1}, O_{2,2}, \ldots, O_{2,k-1}, O_{2,k}$ of the IF selector 43 and the inputs $MI_1, MI_2, \ldots, MI_{k-1}, MI_k$ of the time period multiplexer 44. These function blocks can contain optional mixers, filters, compressors or other components for pre-processing of the analog signal. The compressor can thereby serve for analog reduction of the signal dynamic, for example. Such components are known to the man skilled in the art and are therefore not additionally explained here.

The inputs $MI_1, MI_2, \ldots, MI_{k-1}, MI_k$ are switched by the time period multiplexer 44 to the input AI of the analog-digital converter 16 with a specific clock frequency. Given k inputs of the timer period multiplexer, this clock frequency is preferably k times the sampling frequency of the analog-digital converter 16. Overall, it is thus possible to realize k logical inputs in total with one physical input AI of the MR signal processing device, which k logical inputs can be sampled by the analog-digital converter 16 and be provided for additional processing in digital form in the MR signal processing device 11.

The IF selector 43 can internally be designed in a manner similar to a conventional RCCS 41, whose design is known to the man skilled in the art and therefore does not need to be explained further. Alternatively, a discrete design of the IF selector via individual (possibly also commonly controllable) crossover switches is possible, wherein a preferred exemplary embodiment for a wiring with two local coils $LC_1, LC_2$ with four respective receiver antenna elements $A_{1,1}, A_{1,2}, A_{1,3}, A_{1,4}, A_{2,1}, A_{2,2}, A_{2,3}, A_{2,4}$ is shown in FIGS. 2 and 3.

The internal design of the local coils $LC_1, LC_2$ of the local coil arrangement 30 does not differ from the design of the local coils $LC_1, \ldots, LC_n$ in the exemplary embodiment according to FIG. 1. Since only two local coils $LC_1, LC_2$ are used, all components in the second local coil $LC_2$ are designated with an index of 2 instead of with an index of n, as in the local coil $LC_n$ in FIG. 1.

Likewise, the transmission line arrangement 50 is designed in the same manner, wherein here only four transmission lines $T_{1,1}, T_{1,2}, T_{2,1}, T_{2,2}$ are required.

The RCCS 41 at the transmission signal receiver module 40 can thereby be fashioned so that it again possesses only four inputs $I_{1,1}, I1,2, I_{1,3}, I_{1,4}$, and four outputs $O_{1,1}, O_{1,2}, O_{1,3}, O_{1,4}$. Respectively arranged after these outputs is again a diplex filter 46 of a frequency demultiplexer arrangement 42 which filters the individual modes $M_{1,1}, M_{1,2}, M_{1,3}, M_{1,4}, M_{2,1}, M_{2,2}, M_{2,3}, M_{2,4}$ out of the transmission signals $S_{1,1}, S_{1,2}, S_{1,3}, S_{1,4}$ and places these at the eight inputs $I_{2,1}, I_{2,2}, I_{2,3}, I_{1,4}, I_{1,5}, I_{1,6}, I_{1,7}, I_{1,8}$ of the IF selector 43'.

The IF selector 43' here is discretely designed with four crossover switches $U_1, U_2, U_3, U_4$ in total. The wiring is thereby such that the first input $I_{2,1}$ of the IF selector 43' is placed at a first switch input $U_{1,1}$ of the first crossover switch $U_1$ that is connected at the output side with a first output $O_{2,1}$ of four outputs $O_{2,1}, O_{2,2}, O_{2,3}, O_{2,4}$ of the IF selector 43'. The second input $I_{2,2}$ is connected with a second switch input $U_{1,2}$ of the first crossover switch $U_1$ and is simultaneously connected with a second switch input $U_{4,2}$ of a fourth crossover switch $U_4$ that is connected at the output side with a fourth output $O_{2,4}$ of the IF selector 43'. The third input $I_{2,3}$ is connected with a first switch input $U_{2,1}$ of a second double crossover switch $U_2$, and the fourth input $I_{2,4}$ is connected on the one hand with a second switch input $U_{2,2}$ of this second crossover switch $U_2$ and with a second switch input $U_{3,2}$ of a third crossover switch $U_3$ that is connected on the output side with the third output $O_{2,3}$ of the IF selector 43'. The third crossover switches $U_3$ and $U_4$ are triple crossover switches, wherein the first switch input $U_{3,1}$ of the third crossover switch $U_3$ is connected with the fifth input $I_{2,5}$ of the IF selector 43' and the third switch input $U_{3,3}$ of the third crossover switch $U_3$ is connected with the sixth input $I_{2,6}$ of the IF selector 43'. In the same manner, the first switch input $U4_{,1}$ of the fourth crossover switch $U_4$ is connected with the seventh input $I_{2,7}$ of the IF selector 43' and the third switch input $U_{4,3}$ is connected with the eighth input $I_{2,8}$.

The outputs $O_{2,1}, O_{2,2}, O_{2,3}, O_{2,4}$ of the IF selector 43' are respectively connected via optional function blocks 45 (whose mode of operation was already explained above) to four inputs $MI_1, MI_2, MI_3, MI_4$ of a 4-fold time period multiplexer 44 whose output is connected with the input AI of the analog-digital converter 16 of the MR signal processing device 11. The clock of the time period multiplexer 44 advantageously corresponds to four times the sample rate of the analog-digital converter 16.

In the switch situation of the RCCS 41 that is shown in FIG. 2, the inputs $I_{1,1}, I_{1,2}, I_{1,3}, I_{1,4}$ of the RCCS 41 are switched through directly to the opposite outputs $O_{1,1}, O_{1,2}, O_{1,3}, O_{1,4}$. In this activation of the RCCS 41, via suitable, coordinated switching of the crossover switches $U_1, U_2, U_3, U_4$ (which in turn can ensue with a control signal at a control input $SI_2$) the switch situation shown in FIG. 1 can therefore be achieved on the one hand, in which respectively only the first mode $M_{1,1}$, $M_{1,3}, M_{2,1}, M_{2,3}$ from each mode matrix 34 in each of the local coils $LC_1, LC_2$ is connected through to the inputs $MI_1$, $MI_2, MI_3, MI_4$ of the time period multiplexer 44, and thus to the analog-digital converter 16 of the MR signal processing device 11. For example, this is reasonable when these first modes $M_{1,1}, M_{1,3}, M_{2,1}, M_{2,3}$ are the CP modes and the signals of all receiver antenna elements of all local coils $LC_1$, $LC_2$ should be taken into account although only four logic input channels (that are provided by the time period multiplexer 44) are present.

Since at which of the outputs of the mode matrices 34 the CP is actually present depends on the position of the local coils $LC_1, LC_2$ relative to the basic magnetic field in the scanner of the magnetic resonance system, in the embodiment of the IF selector 43' according to FIG. 2 the possibility also exists to respectively connect through only the second modes $M_{1,2}, M_{1,4}, M_{2,2}, M_{2,4}$ of the mode matrices 34 since, upon rotation of the local coils $LC_1, LC_2$, these second modes $M_{1,2}$, $M_{1,4}, M_{2,2}, M_{2,4}$ correspond precisely to the CP modes. For this only the crossover switches $U_1, U_2, U_3, U_4$ must be switched to the corresponding switch inputs $U_{1,2}, U_{2,2}, U_{3,2}$, $U_{4,2}$. It is also possible to switch only the crossover switches $U_1$ and $U_2$ or only the crossover switches $U_3$ and $U_4$ if only the first local coil $LC_1$ or only the second local coil $LC_2$ lies in a different orientation.

The position in which each of local coils $LC_1, LC_2$ is located can be measured by the system in a calibration measurement or with a suitable coil sensor (not shown) that is located in the local coil $LC_1, LC_2$, and an automatic switching of the IF selector 43' can advantageously ensue.

In a further switch situation of the IF selector 43', the three-fold crossover switches $U_3, U_4$ can respectively be connected with the middle switch input $U_{3,2}, U_{4,2}$. In this switch situation, all modes $M_{1,1}, M_{1,2}, M_{1,3}, M_{1,4}$ of the first local coil $LC_1$ are connected through to the outputs $O_{2,1}, O_{2,2}, O_{2,3}$, $O_{2,4}$ of the IF selector 43' so that these modes can then be supplied to the MR signal processing device 11. This makes sense when the complete signal information of all receiver antenna elements $A_{1,1}, A_{1,2}, A_{1,3}, A_{1,4}$ of the first local coil $LC_1$ should be used for a parallel imaging.

In such a switch situation of the IF selector 43', which of the local coils $LC_1, LC_2$ should be completely polled can be selected by the RCCS 41. FIG. 3 shows the same design as FIG. 1, but in this embodiment it is ensured by switching of the inputs to the two upper outputs $O_{1,1}, O_{1,2}$ of the RCCS 41 that now all modes $M_{2,1}, M_{2,2}, M_{2,3}, M_{2,4}$ of the second local coil $LC_2$ can be connected to the outputs of the IF selector 43'.

At this point it is noted that the discrete circuit shown in FIGS. 2 and 3 can also be realized in a similar manner within the IF selector 43 according to FIG. 1.

FIG. 4 shows a simplified principle block circuit diagram of a magnetic resonance system 1. The core part of this magnetic resonance system 1 is a commercially available tomograph (also called a scanner) 2 in which a patient (not shown) is positioned on a bed 5 in a cylindrical measurement space 4. A whole-body transmission antenna arrangement 3 (for example a birdcage antenna) to emit the magnetic resonance radio-frequency pulses is located within the scanner 2.

The tomograph 2 is controlled by a control device 6. A terminal 15 (or, respectively, control panel) via which an operator can operate the control device 6 and therefore the scanner 2 is connected via a terminal interface 13 to the control device 6. The control device 6 is connected through a scanner control interface 8 and an image acquisition interface 9 with the scanner 2. Via the scanner control interface 8, suitable control commands are output to the scanner 2 via a sequence control unit 10 on the basis of scan protocols so that the desired pulse sequences—i.e. the radio-frequency pulses and the gradient pulses for the gradient coils (not shown) to generate the desired magnetic fields—are emitted. The raw data are acquired via the image data acquisition interface 9, i.e. the received MR response signals are read out.

The control device 6 moreover has a bulk storage 7 in which generated image data (for example) can be stored and measurement protocols can be saved.

An additional interface 14 serves for connection to a communication network 17 that, for example, is connected with an image information system (PACS, Picture Archiving and Communication System) or offers connection possibilities for external data storage.

Both the control device 6 and the terminal 15 can also be integral components of the tomograph 2. The entire magnetic resonance system 1 moreover also possesses all additional typical components or, respectively, features that, however, are not shown in FIG. 4 for better clarity.

In the magnetic resonance system 1 according to the invention, the image data acquisition interface 9 is equipped with the transmission signal receiver module 40 according to the invention as well as an MR signal processing device 11 as is schematically shown in FIGS. 1 through 3, for example, connected after this. Located in the scanner to receive the magnetic resonance response signals is a local coil arrangement 30 with a number of local coils $LC_1, \ldots, LC_n$ that can in turn be connected with the transmission signal receiver module 40 of the image acquisition interface 9 via the transmission line arrangement 50 which can consist of a plurality of transmission cables. In the MR signal processing device 11 the received modes are additionally processed in the manner described in DE 103 13 004 B3, for example. Digital signals are thereby generated that can then be supplied to an image reconstruction unit 12 that generates the desired magnetic resonance image data in a typical manner. For example, these can be stored in the memory 7 or be output at least in part at the operator terminal 15, or be transmitted via the network 17 to other components, such as finding stations or mass storages.

The radio-frequency transmission devices and method described in detail herein are only exemplary embodiments that can be modified many ways by those skilled in the art without departing from the scope of the invention. For example, the first channel switching matrix and/or the second channel switching matrix can also be composed of multiple switching sub-matrices. The same applies for the transmission signal receiver module, whose components can likewise be arranged spatially separated from one another in different housings.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance receiver system comprising:
   an antenna arrangement comprising a plurality of reception antenna elements each configured to receive magnetic resonance signals from an examination subject;
   a combination network arrangement comprising a plurality of combination networks, said plurality of combination networks being respectively supplied with different combinations of said magnetic resonance signals from said reception antenna elements, and each combination network combining the magnetic resonance signals supplied thereto to form a mode, with each of said combination networks forming a different mode from the modes respectively formed by others of said combination networks;
   a frequency multiplexer arrangement connected downstream of said combination network, said frequency multiplexer arrangement comprising a plurality of frequency multiplexers and each frequency multiplexer, by frequency multiplexing, superimposing at least some of said modes to form a common transmission signal;
   a transmission line arrangement comprising a plurality of transmission lines respectively connected to said frequency multiplexers to respectively transmit the respective common transmission signals;
   a first channel switching matrix comprising a plurality of input channels respectively connected to said plurality of transmission lines, and having a plurality of output channels, and a control input, said first channel switching matrix being configured to connect, dependent on a control signal supplied to said control input, at least one of said transmission lines through said first channel switching matrix to one of said output channels;
   a frequency demultiplexer arrangement connected downstream of said first channel switching matrix, said frequency demultiplexer arrangement being supplied with at least one of said common transmission signals from an output channel of said first channel switching matrix and being configured to filter the modes that were superimposed in said common transmission signal out of said common transmission signal; and
   a second channel switching matrix connected downstream of said frequency demultiplexer arrangement configured to supply the modes that were filtered out of said common transmission channel to a magnetic resonance signal processing device.

2. A magnetic resonance receiver system as claimed in claim 1 comprising a time period multiplexer arrangement connected downstream of said second channel switching matrix that switches multiple ones of said modes filtered out of said common transmission signal to a common input of said magnetic resonance signal processing device.

3. A magnetic resonance receiver system as claimed in claim 1 wherein said frequency multiplexer arrangement is configured to reduce said modes to intermediate frequencies when superimposing said modes to form said common transmission signal.

4. A magnetic resonance receiver system as claimed in claim 3 wherein said magnetic resonance signal processing device comprises an analog-to-digital converter for the modes supplied thereto, said analog-to-digital converter operating with a sampling frequency, and wherein said frequency multiplexer arrangement employs intermediate frequencies that are mirror-symmetrical to said sampling frequency, or to a multiple of said sampling frequency.

5. A magnetic resonance receiver system as claimed in claim 1 wherein said reception antenna elements are combined into a plurality of reception antenna modules, with each reception antenna module being integrated with at least one of said combination networks and one frequency multiplexer in said frequency multiplexer arrangement.

6. A magnetic resonance receiver system as claimed in claim 1 wherein at least some of said combination networks are configured to superimpose said modes to generate a circularly polarized mode.

7. A magnetic resonance receiver system as claimed in claim 1 wherein said frequency multiplexer arrangement comprises a plurality of diplex filters that respectively superimpose two of said modes to form said common transmission signal.

8. A magnetic resonance reception system as claimed in claim 7 wherein said frequency demultiplexer arrangement comprises a plurality of diplex filters that filter said two modes out of said common transmission signal.

9. A magnetic resonance receiver system as claimed in claim 1 wherein said frequency demultiplexer arrangement comprises a plurality of frequency demultiplexers and wherein said second channel switching matrix comprises a plurality of cross-over switches respectively connected with said frequency demultiplexers, to selectively connect one output of the frequency demultiplexer through to said magnetic resonance signal processing device.

10. A magnetic resonance receiver system as claimed in claim 1 wherein said reception antenna elements are combined into a plurality of reception antenna modules, with each reception antenna module being integrated with at least one of said combination networks and one frequency multiplexer in said frequency multiplexer arrangement and wherein at least some of said combination networks are configured to generate a circularly polarized mode in said common transmission signal, and wherein said second channel switching matrix is configured to switch between a first switching situation in which respective circularly polarized modes of all of said reception antenna modules are switched to respective inputs of said magnetic resonance signal processing device, and a second switching situation in which all modes of at least one of said reception antenna modules are switched to inputs of said magnetic resonance signal processing device.

11. A reception antenna module for a magnetic resonance system comprising:
   an antenna arrangement comprising a plurality of reception antenna elements each configured to receive magnetic resonance signals from an examination subject;
   a combination network arrangement comprising a plurality of combination networks, said plurality of combination networks being respectively supplied with different combinations of said magnetic resonance signals from said reception antenna elements, and each combination network combining the magnetic resonance signals supplied thereto to form a mode, with each of said combination networks forming a different mode from the modes respectively formed by others of said combination networks;

a frequency multiplexer arrangement connected downstream of said combination network, said frequency multiplexer arrangement comprising a plurality of frequency multiplexers and each frequency multiplexer, by frequency multiplexing, superimposing at least some of said modes to form a common transmission signal.

12. A transmission signal receiver module for a magnetic resonance system comprising:
   a first channel switching matrix comprising a plurality of input channels respectively supplied with common transmission signals comprised of multiple superimposed modes of magnetic resonance signals, and having a plurality of output channels, and a control input, said first channel switching matrix being configured to connect, dependent on a control signal supplied to said control input, at least one of said transmission lines through said first channel switching matrix to one of said output channels;
   a frequency demultiplexer arrangement connected downstream of said first channel switching matrix, said frequency demultiplexer arrangement being supplied with at least one of said common transmission signals from an output channel of said first channel switching matrix and being configured to filter the modes that were superimposed in said common transmission signal out of said common transmission signal; and
   a second channel switching matrix connected downstream of said frequency demultiplexer arrangement configured to supply the modes that were filtered out of said common transmission channel to a magnetic resonance signal processing device.

13. A magnetic resonance system comprising:
   a magnetic resonance data acquisition unit;
   an antenna arrangement in said magnetic resonance data acquisition unit comprising a plurality of reception antenna elements each configured to receive magnetic resonance signals from an examination subject in the magnetic resonance data acquisition unit;
   a combination network arrangement comprising a plurality of combination networks, said plurality of combination networks being respectively supplied with different combinations of said magnetic resonance signals from said reception antenna elements, and each combination network combining the magnetic resonance signals supplied thereto to form a mode, with each of said combination networks forming a different mode from the modes respectively formed by others of said combination networks;
   a frequency multiplexer arrangement connected downstream of said combination network, said frequency multiplexer arrangement comprising a plurality of frequency multiplexers and each frequency multiplexer, by frequency multiplexing, superimposing at least some of said modes to form a common transmission signal;
   a transmission line arrangement comprising a plurality of transmission lines respectively connected to said frequency multiplexers to respectively transmit the respective common transmission signals;
   a first channel switching matrix comprising a plurality of input channels respectively connected to said plurality of transmission lines, and having a plurality of output channels, and a control input, said first channel switching matrix being configured to connect, dependent on a control signal supplied to said control input, at least one of said transmission lines through said first channel switching matrix to one of said output channels;
   a frequency demultiplexer arrangement connected downstream of said first channel switching matrix, said frequency demultiplexer arrangement being supplied with at least one of said common transmission signals from an output channel of said first channel switching matrix and being configured to filter the modes that were superimposed in said common transmission signal out of said common transmission signal;
   a magnetic resonance signal processing device; and
   a second channel switching matrix connected downstream of said frequency demultiplexer arrangement configured to supply the modes that were filtered out of said common transmission channel to said magnetic resonance signal processing device.

14. A method for transmitting magnetic resonance signals from an antenna arrangement in a magnetic resonance system, comprising the steps of:
   with an antenna arrangement comprising a plurality of reception antenna elements receiving magnetic resonance signals from an examination subject with the respective antenna elements;
   supplying different combinations of said magnetic resonance signals from said reception antenna elements to respective combination networks and, in each combination network, combining the magnetic resonance signals supplied thereto to form a mode, with each of said combination networks forming a different mode from the modes respectively formed by others of said combination networks;
   in each of a plurality of frequency multiplexers, superimposing, by frequency multiplexing, at least some of said modes to form a common transmission signal;
   transmitting the respective common transmission signals to a first channel switching matrix comprising a plurality of input channels and a plurality of output channels, and a control input, and in said first channel switching matrix connecting, dependent on a control signal supplied to said control input, at least one of said transmission lines through said first channel switching matrix to one of said output channels;
   by frequency demultiplexing, filtering the modes that were superimposed in said common transmission signal out of said common transmission signal at said output of said first switching matrix; and
   from a second channel switching matrix, supplying the modes that were filtered out of said common transmission channel to a magnetic resonance signal processing device.

* * * * *